United States Patent [19]

Cunningham et al.

[11] Patent Number: 5,330,629

[45] Date of Patent: Jul. 19, 1994

[54] METHOD FOR DEPOSITING ALUMINUM LAYERS ON INSULATING OXIDE SUBSTRATES

[75] Inventors: John E. Cunningham, Lincroft; William Y. Jan, Scotch Plains; John A. Rentschler, Brick; Colin A. Warwick, Holmdel, all of N.J.

[73] Assignee: AT&T Bell Laboratories, Murray Hill, N.J.

[21] Appl. No.: 990,959

[22] Filed: Dec. 15, 1992

[51] Int. Cl.$^5$ ................................. C23C 4/08
[52] U.S. Cl. ..................... 204/192.17; 204/192.15; 204/192.25; 427/255.1; 427/255.2; 437/165
[58] Field of Search ............ 204/192.17, 192.25; 437/104, 107, 165; 427/255.1, 255.2

[56] References Cited

U.S. PATENT DOCUMENTS

| | | | |
|---|---|---|---|
| 3,391,017 | 7/1968 | Bolger et al. | 437/104 |
| 4,254,189 | 3/1981 | Fisher | 428/626 |
| 4,450,207 | 5/1984 | Donomoto et al. | 428/614 |
| 4,462,881 | 7/1984 | Yamamoto et al. | 204/192.17 |
| 4,975,299 | 12/1990 | Mir et al. | 437/104 |
| 5,071,791 | 12/1991 | Inoue et al. | 204/192.17 |
| 5,118,661 | 6/1992 | Maeda | 204/192.15 |
| 5,171,642 | 12/1992 | DeHaven et al. | 204/192.17 |
| 5,217,589 | 6/1993 | Arledge et al. | 204/192.17 |

*Primary Examiner*—Anthony McFarlane
*Attorney, Agent, or Firm*—Martin I. Finston

[57] ABSTRACT

A manufacturing method which includes forming a metallic, aluminum-containing layer adherent to a surface of a body. The method includes the steps of depositing aluminum on the surface from an aluminum-containing vapor, and during the aluminum-depositing step, the further step of depositing arsenic, phosphorus, or antimony on the surface from the vapor.

11 Claims, 1 Drawing Sheet

METHOD FOR DEPOSITING ALUMINUM LAYERS ON INSULATING OXIDE SUBSTRATES

FIELD OF THE INVENTION

This invention relates to methods for depositing thin metal layers on insulating surfaces, and more particularly to aluminum metallization techniques for semiconductor integrated circuits.

ART BACKGROUND

With reference to FIG. 1, modern designs for integrated circuits (ICs) often call for one or more conductive, usually metallic, patterned, interconnection layers 10 separated from the semiconductive substrate 20 and each other by one or more insulating layers 30. These insulating layers, usually made of silicon dioxide or some other glassy material, are referred to as interlevel dielectric layers. In structures of this kind, vertical electrical connections are typically made between selected, vertically adjacent places on different conductive levels by opening a window 40, often referred to as a "via", in an interlevel dielectric layer before depositing the upper one of the two conductive layers that are to be joined. The via extends down to an underlying conductive layer or the semiconductive substrate. The sidewalls 50 of the via are coated with a conductor, typically during the deposition of the upper conductive layer. Ideally, this conductive coating should be thick enough to completely fill the via. The conductive material is typically an aluminum alloy, for example 98.5% aluminum, 1% copper, and 0.5% silicon by weight, deposited by a physical vapor deposition process such as vacuum evaporation or sputtering. It may be deposited directly on the insulator, or on top of a metallic barrier layer that is interposed between the insulator and the aluminum to prevent chemical reaction between the two.

There are economic pressures to increase the circuit density of ICs. For that reason, it is desirable to make the diameter at the top of the via as small as possible. However, considerations of current leakage and parasitic capacitance impose a lower limit on the thickness of the interlevel dielectric layer (thicknesses of 0.4–1.2 μm are typical). As a result, the ratio of the insulating layer thickness to the via diameter, termed the "via aspect ratio", must be high, for example 1:1 or even 2:1.

Furthermore, it is desirable to make the via as nearly like a right circular cylinder as possible, rather than like a truncated cone. The cylindrical shape helps provide a sufficient area for contacting the conductive or semiconductive substance below. That is, because the contact conductance is generally proportional to the area of the bottom of the via, a via with a fixed top diameter will have greater contact resistance the more steeply its sidewalls are inclined.

One measure of the quality of the metallic coating of via sidewalls is the step coverage, defined as the ratio of the smallest metal thickness deposited on the sidewall, to the metal thickness on the upper surface of the interlevel dielectric.

Practitioners have encountered difficulties in filling high-aspect-ratio vias, or in coating them with high step coverage. Shadowing effects make make it difficult to deposit sufficient material on the sidewalls. The deposited alloy will readily fill the via only if two conditions are met: the metal must be sufficiently plastic for diffusion to be significant (generally requiring a temperature above about 300° C.), and the metal must efficiently wet the surface of the insulating layer within and adjacent to the via.

In the absence of efficient wetting, the metal will flow into a discontinuous film of droplets having contact angles near 90°. Surface tension can prevent these droplets from straddling the sharp corner at the mouth of the via, and can prevent them from moving efficiently down the sidewalls. On the other hand, in the absence of thermal diffusion, the metal will not flow significantly at all, and in particular will not flow efficiently down the sidewalls. Moreover, the alloy deposited on the upper surface of the insulating layer near the rim of the via will tend to form isolated beads 60 rather than coat the sidewalls. As these beads grow during deposition, they can shadow the sidewall even further and eliminate almost all direct deposition onto the sidewall. As a consequence, step coverage will fall below desired values. At worst, the beads can grow, bridge the via, and completely cut off any direct deposition to the sidewalls or bottom of the via.

A potential solution to this problem is to modify the composition of the deposited alloy to make it wet the insulator more efficiently. An appropriate additive is one that will reduce $\sigma_{LV}$, which is the specific interface energy (SIE) between the alloy and the ambient atmosphere, relative to the difference $\sigma_{SV} - \sigma_{LS}$. In the preceding expression, $\sigma_{SV}$ is the SIE between the insulator (i.e., substrate) and the ambient atmosphere (i.e., vapor phase), and $\sigma_{LS}$ is the SIE between the alloy (i.e., liquid phase) and the insulator. Such an additive will reduce the contact angle, or even cause complete wetting if the alloy-ambient SIE is made less than $\sigma_{SV} - \sigma_{LS}$. The interfaces relevant to the definitions of $\sigma_{LV}$, $\sigma_{SV}$, and $\sigma_{LS}$ are shown schematically in FIG. 2.

Practitioners of the metallurgical arts have, in fact, considered problems of wetting at aluminum surfaces. For example, U.S. Pat. No. 4,254,189 issued to R. D. Fisher on Mar. 3, 1981, discusses metallurgical problems related to computer disc memories that include magnetically sensitive material, a substrate that may be aluminum or an aluminum alloy, and an intermediate layer between the substrate and the magnetic material. It is desirable for the intermediate layer to wet the aluminum substrate. An exemplary treatment for improving the wettability of the aluminum surface is to coat it with a monolayer of chromium or titanium, thereby increasing the interface energy of the aluminum surface. As a consequence, adhesion of glass or metal intermediate layers is improved.

As a further example, U.S. Pat. No. 4,450,207, issued to T. Donomoto, et al. on May 22, 1984, discusses the use of carbon or alumina fibers to reinforce an aluminum alloy. An alloy composition which includes 0.5%–4.5% magnesium is found to improve the wettability of the reinforcing fibers by the molten alloy. This is attributed to binding of magnesium atoms to the O and OH radicals attached to the surface of the reinforcing fibers.

The above examples show that practitioners have attempted, for some purposes, to improve aluminum adhesion by modifying the surface, or the bulk composition, of an aluminum body. However, practitioners have failed to provide a modification that leads to improved wetting of an insulating substrate by a deposited aluminum film.

SUMMARY OF THE INVENTION

We have discovered that the wetting of surfaces by deposited aluminum is improved if the aluminum, as deposited, contains an admixture of arsenic. According to our current belief, not only only arsenic will be effective in this regard, but also the chemically similar elements phosphorus and antimony. Accordingly, the invention, in one embodiment, involves a method for forming a metallic, aluminum-containing layer adherent to a surface of a body. The method includes the steps of depositing aluminum on the surface from an aluminum-containing vapor, and before and/or during the aluminum-depositing step, the further step of depositing arsenic on the surface from the vapor. In a particular embodiment of the invention, the body comprises an insulating material.

DETAILED DESCRIPTION as noted, we have discovered that the addition of arsenic to deposited aluminum or aluminum alloy will improve its ability to wet substrate surfaces. We believe that this improvement will apply not only to insulating substrate materials, but to metallic and semiconductive substrate materials as well. Moreover, we believe that this improvement will apply irrespective of whether the substrate material is single-crystalline, polycrystalline, or amorphous.

We have found the invention to be particularly useful for depositing metallization layers on interlevel dielectric layers that have been formed on semiconductive substrate wafers for subsequent processing into integrated circuits. The dielectric layer is typically amorphous or glassy silicon dioxide, although other insulating materials may be used for this purpose, such as the nitrides or oxynitrides of silicon. The inventive method improves the deposition of aluminum on the sidewalls of vias cut in the dielectric layer. As a consequence, step coverage is increased, and uniform filling of vias is promoted.

Figure 1:
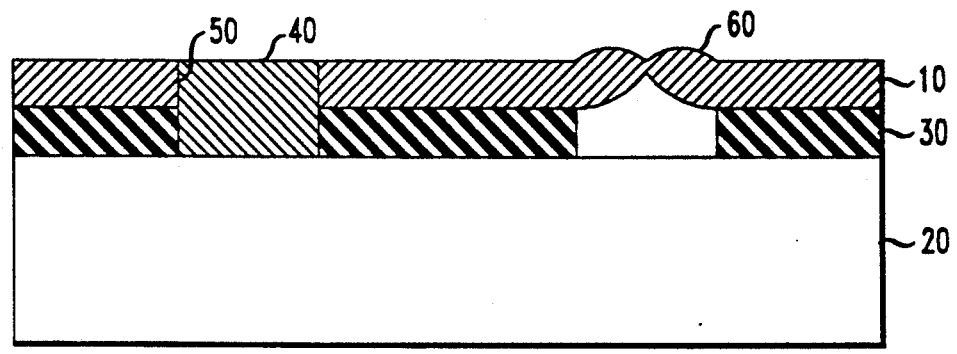
FIG. 1 is a schematic, cross-sectional view of two vias cut in an interlevel dielectric layer overlying a semiconductor substrate. One of the vias shown has been successfully filled with a metal conductor, but an attempt to fill the other via has failed, at least partly because of surface-tension effects.
Figure 2:
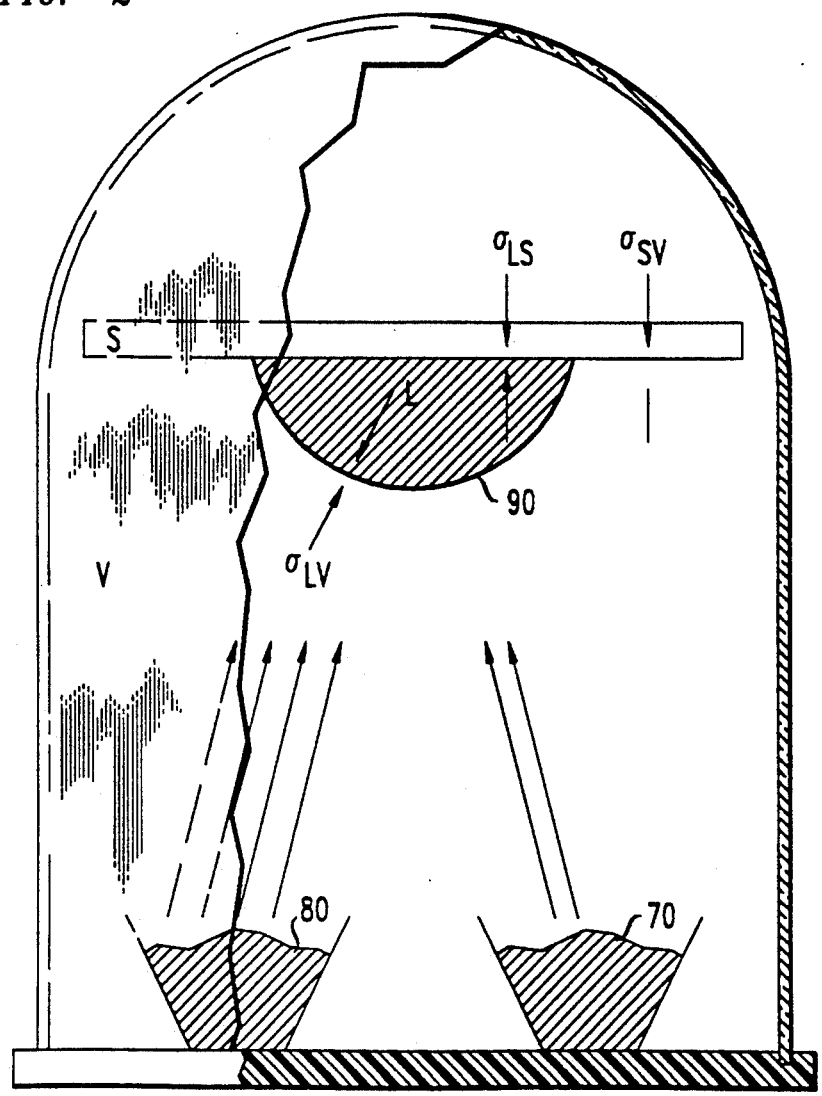
FIG. 2 is a schematic diagram of a process for depositing an alloyed or mixed material on a substrate within a vacuum chamber. Also shown are the relevant interfaces for describing the wetting behavior of the deposited material.

As noted, the surface energy of the interface between the warm, deposited aluminum and the deposition ambient, typically a partial vacuum, is reduced by mixing a suitable additive 70 with the aluminum 80. This is shown schematically in FIG. 2. To be suitable for making interlevel electrical connections, an additive must not only be effective for reducing the surface energy, but must also form a conductive interface, and not an insulating barrier, at the bottom of the via, where the aluminum is deposited to form an electrical contact region. We have found that arsenic is such an additive. A currently preferred concentration of arsenic is about 1%. There should be enough arsenic present to assure that a concentrated, thin, near-surface region 90 (possibly, but not necessarily, an arsenic-terminated aluminum arsenide monolayer) can form at the aluminum-ambient interface. This will be the case at least at a concentration of about 1%. Provided that enough arsenic is present for such a surface layer to form, modest additional concentrations of arsenic will have relatively little further effect on wetting. We believe that qualitatively similar behavior will be observed for admixtures of phosphorus or antimony in the deposited aluminum, because of the well-known chemical similarities between arsenic, phosphorus, and antimony.

It is desirable to deposit the aluminum layer by a physical deposition method such as sputtering or vacuum evaporative deposition. By way of example, these methods are readily used to deposit an aluminum film 0.4–1.2 $\mu$m thick. We have successfully deposited aluminum at rates of 1–200 Å/s either by vacuum evaporation or by low pressure argon sputtering from an aluminum source, termed a "target".

We have found that if substantial concentrations of oxygen or water vapor are present, the beneficial effects of the arsenic are nullified. We believe that the surface of the deposited aluminum film becomes oxidized under these conditions. The oxide crust prevents surface diffusion, and inhibits grain growth and via filling. Films deposited in the presence of oxygen or water vapor have a rough surface on a length scale comparable to the wavelength of visible light, and consequently appear cloudy. This problem is avoided by maintaining a background pressure less than about $1.3 \times 10^{-4}$ Pa ($10^{-6}$ torr), and by using a load-lock that permits the operator to insert the wafer into the vacuum chamber without exposing the source materials of aluminum and arsenic to atmospheric pressure.

To assure a uniform deposited layer, particularly when filling vias, it is advantageous to deposit relatively slowly, or to keep the wafer hot immediately after deposition, or both. That is because, at the lower deposition rates, diffusion makes a greater relative contribution to the distribution of deposited material.

A currently preferred sputtering target comprises an aluminum alloy body having four cavities symmetrically disposed therewithin. Each cavity is filled with copper arsenide. The composite surface area of the open diameters of the cavities is equal to approximately 1% of the surface area of the whole target. Such a target is variously termed a "plug" target or a "mosiac" target.

For vacuum evaporation, the sources of aluminum and arsenic are in two respective, heated cells, termed "Knudsen Cells", situated within the vacuum chamber. One cell contains pure aluminum, and is heated to 1050° C.–1150° C., with 1120° C. being the preferred temperature. The second cell contains pure arsenic, and is heated to 170° C.–270° C., with 200° C. being the preferred temperature. These conditions were selected to give a deposition rate for aluminum of about 1 Å/s, and a deposition rate for arsenic of about 0.01 times the aluminum deposition rate throughout the deposition. Alternatively, the temperature of the arsenic cell can be raised, and the shutter in front of that cell opened for only a brief period of time at the beginning of the aluminum deposition, to form a thin layer of aluminum arsenide about 20–40 Å thick. The aluminum deposition would then proceed with the arsenic cell closed.

Because it is desirable to activate diffusion effects which more evenly distribute the deposited material, the substrate is desirably heated to at least 300° C. during deposition. More specifically, it is desirable to heat the substrate wafer to at least about 60% of the melting point of the deposited material, expressed on the thermodynamic or Kelvin scale. For aluminum, which melts at about 933° K. or 660° C., this temperature is about 287° C. However, it is also desirable to avoid heating the substrate above about 400° C.–450° C. for prolonged periods, since above this temperature range, aluminum tends to react chemically with silicon and silicon dioxide. To some extent, these reactions can be prevented by depositing a metallic barrier film before the aluminum film. In this case, we believe higher temperatures can be used. In this case too, the added arsenic will improve the wettability of the barrier metal by the aluminum.

EXAMPLE

We sputter-deposited aluminum, using a modified Tosoh SMD Inc. aluminum source target installed in a Varian Associates Mod. 3180 sputter coating system. The target contained a grain stabilizer of 3 ppm silicon, by weight, and was otherwise 99.999% pure aluminum. The target was toroidally shaped with an inner diameter of about 80 mm and an outer diameter of about 170 mm. Four holes, each about 8 mm in diameter, were machined equidistant on a principle circle diameter of 125 mm. The active area of this target was about 5000 mm$^3$. Polycrystalline copper arsenide ($Cu_3As$) was pressed into the holes. (Unlike arsenic, which is quite brittle, copper arsenide is somewhat malleable. As a consequence, we found that the target was more conveniently loaded with copper arsenide than with pure arsenic.) After evacuation to $4 \times 10^{-5}$ Pa ($3 \times 10^{-7}$ torr), the surface of the target was removed by prolonged sputtering onto the shutter.

Onto a single crystal silicon wafer, 12.7 cm (5 in.) in diameter, we deposited a 0.6-μm layer of silicon dioxide by pyrolytic decomposition of tetraethoxysilane (Si-($OC_2H_5)_4$) at 700° C. A pattern consisting of vias ranging in diameter from 0.4 μm to 2 μm was etched into the silicon dioxide using masked reactive ion etching. The mask was patterned in photoresist using standard lithographic techniques. After patterning, the photoresist was removed and the wafer cleaned by standard techniques.

The wafer was inserted through the load lock of the sputtering system. At the preparation station, about 10 nm of silicon dioxide, together with overlying surface contamination, was removed by a radio-frequency sputter etch. The ambient atmosphere was 0.9 Pa (7 millitorr) of argon.

The wafer was then moved to the deposition station and preheated at 350° C. for 10 seconds. The power to the sputter source was ramped up from the standby level of 1200 W to the deposition level of 8160 W over a period of 10 seconds. The source was maintained at the deposition level for 5 more seconds to allow it to stabilize. The shutter was then opened for 10 seconds, resulting in deposition of about 200 nm of metal. The shutter was then closed and the power ramped down. However, the wafer was held on the heat station for 100 more seconds to diffuse the deposited material. The wafer was then cooled and removed through the load lock.

The sample exhibited a specular surface. Scanning electron microscopic examination of cleaved cross-sections of the wafer revealed a smooth surface, and conformal coverage of the bottoms and sidewalls of the vias.

We claim:

1. A method for manufacturing an article which comprises a substrate body, wherein the substrate body includes an insulating material region having a principal surface, the method comprising the steps of:
   a) depositing on the surface, from an aluminum-containing vapor, a metallic layer that substantially comprises metallic aluminum; and
   b) during step (a), depositing on the surface, from the vapor, an additional element such that the additional element is incorporated in the metallic layer in an amount effective for improving the wetting of the surface by the metallic layer, the additional element selected from the group consisting of arsenic, phosphorus, and antimony.

2. The method of claim 1, wherein the additional element is arsenic.

3. The method of claim 1, wherein Step (b) is carried out such that the additional element is incorporated in an average concentration of at least about 1%.

4. The method of claim 1, further comprising, during Step (a), the step of maintaining the substrate body at a temperature of at least about 300° C., but not more than about 400° C.

5. The method of claim 1, wherein Step (a) comprises depositing the metallic layer by sputtering.

6. The method of claim 1, wherein the insulating material region comprises an insulating oxide.

7. The method of claim 1, wherein the insulating material region comprises silicon dioxide.

8. A method for manufacturing an article which comprises a wafer of semiconductor material overlain by a layer of insulating material at least partially penetrated by a hole having sidewalls and a bottom, the method comprising the steps of:
   a) from an aluminum-containing vapor, depositing a metallic layer that comprises aluminum onto the surface such that the hole is filled by the metallic layer; and
   b) during step (a), depositing onto the surface, from the vapor, an additional element such that the additional element is incorporated in the metallic layer, the additional element selected from the group consisting of arsenic, phosphorus, and antimony.

9. The method of claim 8, wherein the hole has an aspect ratio of 1 or more, and the additional element is incorporated in an amount effective for promoting uniform filling of the hole.

10. The method of claim 8, wherein the hole has an aspect ratio of 1 or more, and the additional element is incorporated in an amount effective for increasing the ratio of the smallest thickness of metallic layer material deposited on the sidewalls, to the thickness of metallic layer material deposited on the layer of insulating material adjacent the hole.

11. The method of claim 1, wherein step (b) comprises sputtering a target comprising polycrystalline copper arsenide.

* * * * *